US006559702B2

(12) United States Patent
Hinterscher

(10) Patent No.: US 6,559,702 B2
(45) Date of Patent: May 6, 2003

(54) BIAS GENERATOR AND METHOD FOR IMPROVING OUTPUT SKEW VOLTAGE

(75) Inventor: Gene Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/910,511

(22) Filed: Jul. 19, 2001

(65) Prior Publication Data

US 2003/0016078 A1 Jan. 23, 2003

(51) Int. Cl.[7] ........ H03K 17/687
(52) U.S. Cl. ........ 327/309; 327/108; 327/262
(58) Field of Search ........ 327/362, 530, 327/537, 540, 309, 538, 541, 262, 108, 112

(56) References Cited

U.S. PATENT DOCUMENTS 5,537,070 A * 7/1996 Risinger ........ 327/362
6,040,729 A * 3/2000 Sanchez et al. ........ 327/437

* cited by examiner

*Primary Examiner*—Dinh T. Le
(74) *Attorney, Agent, or Firm*—William B. Kempler; W. James Brady; Frederick J. Telecky, Jr.

(57) ABSTRACT

A method as well as a bias generator and associated output circuit architecture (300) that protects output skew voltage capabilities for the associated output circuit (304) to a greater extent than that achievable using presently known circuit architectures and techniques. A voltage level detector (306) comprising a differential-pair circuit detects bias voltage levels and provides a signal (308) to skew adjusting assist devices (310, 312) when the bias voltage levels get close to a "choking off" voltage level. The signal (308) turns on the skew adjusting assist devices (310, 312) to assist the skew adjusting devices (102, 104).

7 Claims, 5 Drawing Sheets

BIAS GENERATOR AND METHOD FOR IMPROVING OUTPUT SKEW VOLTAGE

BACKGROUND OF THE INVENTION

1. Field of the Invention

This invention relates generally to bias generator circuits, and more particularly to a bias generator circuit architecture and method that protects output skew voltage capabilities for an associated output circuit.

2. Description of the Prior Art

Known bias generator circuits are problematic in that they generate bias voltages to their associated output circuits that are inordinately sensitive to process, temperature and supply voltage variations, thereby limiting overall circuit performance capabilities. When the process is strong, temperature is low and supply voltage is at the maximum level, the output low-to-high and high-to-low propagation delays associated with an output circuit that is biased via the bias generator circuit are at their fastest. When the process is weak, temperature is high and supply voltage is at the minimum level, the output low-to-high and high-to-low propagation delays associated with an output circuit that is biased via the bias generator circuit are at their slowest.

FIG. 1A is a schematic diagram illustrating a known output voltage bias generator 10 that supplies different voltage levels (biasp 12 and biasn 14) to an output circuit 100 illustrated in FIG. 1B, wherein the different voltage levels are sensitive to variations in the process, ambient and operating temperatures, supply voltage and resistor tolerance. The bias generator 10 in combination with output circuit 100 promotes tight low-to-high and high-to-low output skews over the variation of operating conditions.

When the process is strong, temperature is low and supply voltage is at the maximum level (herein referred to as the first operating condition), the biasp 12 level is at a higher voltage level and the biasn 14 level is at a lower voltage level than they would otherwise be when the process is weak, temperature is high and supply voltage is at its minimum level (herein after referred to as the second condition). During a first condition situation therefore, the biasp 12 and biasn 14 voltage levels are closer to the thresholds of the skew adjusting devices MNSKEW1 (102) and MNSKEW2 (104), and will weaken the skew adjusting devices 102, 104. This will slow down the low-to-high and high-to-low propagation delays, pushing the skew closer to the second operating condition.

During a second condition situation, the biasp 12 level is at a lower voltage level than it would otherwise be during a first condition situation; and the biasn 14 level is at a higher voltage level than it would be during a first condition situation. During a second condition situation therefore, the biasp 12 and biasn 14 voltage levels "turn on" the skew adjusting devices 102, 104 harder than during a first condition situation, and will not weaken the skew adjusting devices 102, 104 as much as that caused during a first condition situation. The foregoing described varying voltage levels for biasp 12 and biasn 14 will cause the low-to-high and high-to-low skews to become tighter over process, temperature and supply voltage extremes.

The output voltage bias generator 10 is problematic however, in that it can get into a condition (variation in process, temperature, supply voltage and resistor tolerance) where the biasp 12 and biasn 14 voltage levels supplied to the skew adjusting devices 102, 104 in the output circuit 100 are at a "choking off" voltage level (i.e. weakening the skew devices 102, 104 by supplying biasp 12 and biasn 14 voltage levels to their respective gates that are too close the operating voltage thresholds). Although a designer can adjust certain parameters associated with the output voltage bias generator 10 to compensate for specific conditions, such adjustments will degrade the skew adjusting capabilities of the output voltage bias generator 10, and therefore reduce the usefulness of the output voltage bias generator 10.

FIG. 2 is a waveform plot diagram 200 illustrating input and output waveforms 202, 204 associated with the output voltage bias generator 10 and the output circuit 100 with a supply voltage of 3.3 volts at a nominal operating temperature of 25° C. Two operating conditions can be seen to need assistance. The first such operating condition is associated with a strong process coupled with a nominal resistance variation. The second such operating condition is associated with a strong process and a weak resistance variation. It can be appreciated that similar assistance is also necessary for other variations associated with process, temperature, supply voltage and resistor tolerance.

In view of the foregoing, a need exists for a bias generator and associated output circuit architecture that protects output skew voltage capabilities for the associated output circuit to a greater extent than that achievable using presently known circuit architectures.

SUMMARY OF THE INVENTION

The present invention is directed to a method as well as a bias generator and associated output circuit architecture that protects output skew voltage capabilities for the associated output circuit to a greater extent than that achievable using presently known circuit architectures. A differential-pair circuit detects bias voltage levels provided by the bias generator and provides a signal to skew adjusting assist devices within the associated output circuit when the bias voltage levels get close to a "choking off" voltage level. The signal turns on the skew adjusting assist devices to assist the skew adjusting devices.

According to one aspect of the invention, an improved output skew voltage bias generator is provided to enhance an existing circuit in achieving its skew adjusting potential without concern for the existing circuit defaulting to a condition with very slow propagation delay results.

According to another aspect of the invention, an improved output skew voltage bias generator is provided to enhance existing circuit manufacturing yields.

According to yet another aspect of the invention, an improved output skew voltage bias generator is provided to enhance an existing circuit in maximizing its skew adjusting potential such that the existing circuit will have smaller skew variations.

One embodiment of the present invention comprises a voltage bias generator comprising:

- an output circuit having a plurality of voltage skew adjusting devices and a plurality of voltage skew assist devices, the output circuit responsive to an input signal to generate an output signal having a desired skew;
- a bias voltage circuit configured to generate desired bias voltage signals for the plurality of voltage skew adjusting devices; and
- a voltage sensing circuit responsive to at least one of the desired bias voltage signals to generate desired bias voltage signals for the plurality of voltage skew assist devices such that the output signal will have the desired skew.

Another embodiment of the present invention comprises a voltage bias generator comprising:

voltage skew adjusting means for adjusting an output skew voltage associated with an output signal in response to an input signal;

voltage skew assisting means for assisting the voltage skew adjusting means such that the voltage skew adjusting means will not be choked off during at least one marginal operating condition selected from the group consisting of temperature, process, supply voltage and resistor tolerance;

biasing means for biasing the voltage skew adjusting means; and voltage detecting means for detecting bias voltage output signals associated with the biasing means and for generating desired bias voltage signals for the voltage skew assisting means such that the output signal will have a desired skew.

Yet another embodiment of the present invention comprises a voltage bias generator operational to sense an input voltage signal and generate an output signal having a desired voltage skew, the voltage bias generator comprising skew adjusting devices responsive to first internally generated bias signals and further comprising skew assist devices responsive to second internally generated bias signals to assist the skew adjusting devices control the desired voltage skew such that the skew adjusting devices are not choked off during at least one marginal operating condition selected from the group consisting of temperature, process, supply voltage and resistor tolerance.

Still another embodiment of the present invention comprises a method of controlling output skew voltage, the method comprising the steps of:

providing a voltage bias generator comprising skew voltage adjusting devices and skew assist devices;

providing an input signal to the skew voltage adjusting devices;

processing the input signal via the skew voltage adjusting devices to generate an output voltage signal having a desired skew; and adjusting process control characteristics associated with the skew voltage adjusting devices via the skew assist devices such that the skew adjusting devices are not choked off during at least one marginal operating condition selected from the group consisting of temperature, process, supply voltage and resistor tolerance.

BRIEF DESCRIPTION OF THE DRAWINGS

Other aspects, features and advantages of the present invention will be readily appreciated as the invention becomes better understood by reference to the following detailed description when considered in connection with the accompanying drawing figure wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
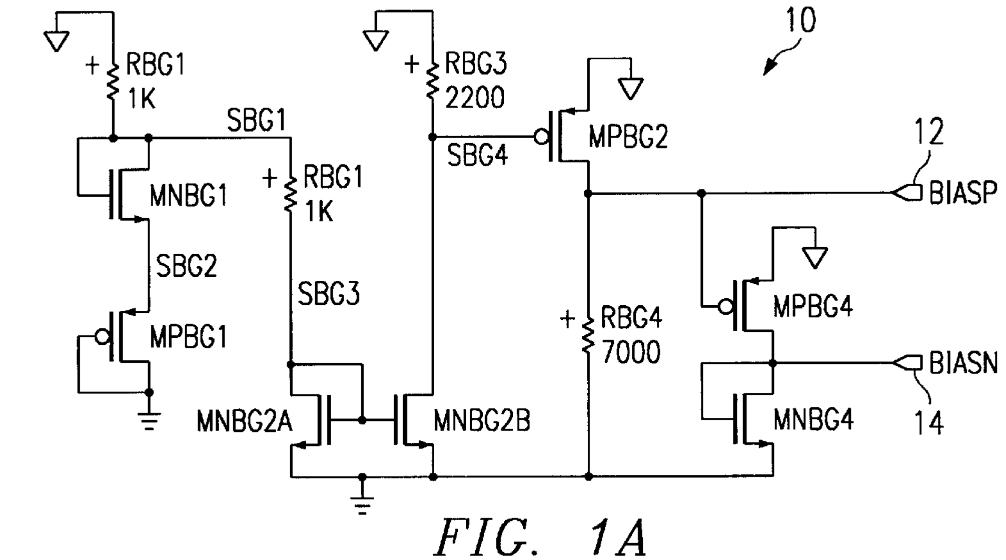
FIG. 1A (PRIOR ART)
FIG. 1A is a schematic diagram illustrating a known output voltage bias generator that supplies different voltage levels (biasp and biasn) to an output circuit.
Figure 1B:
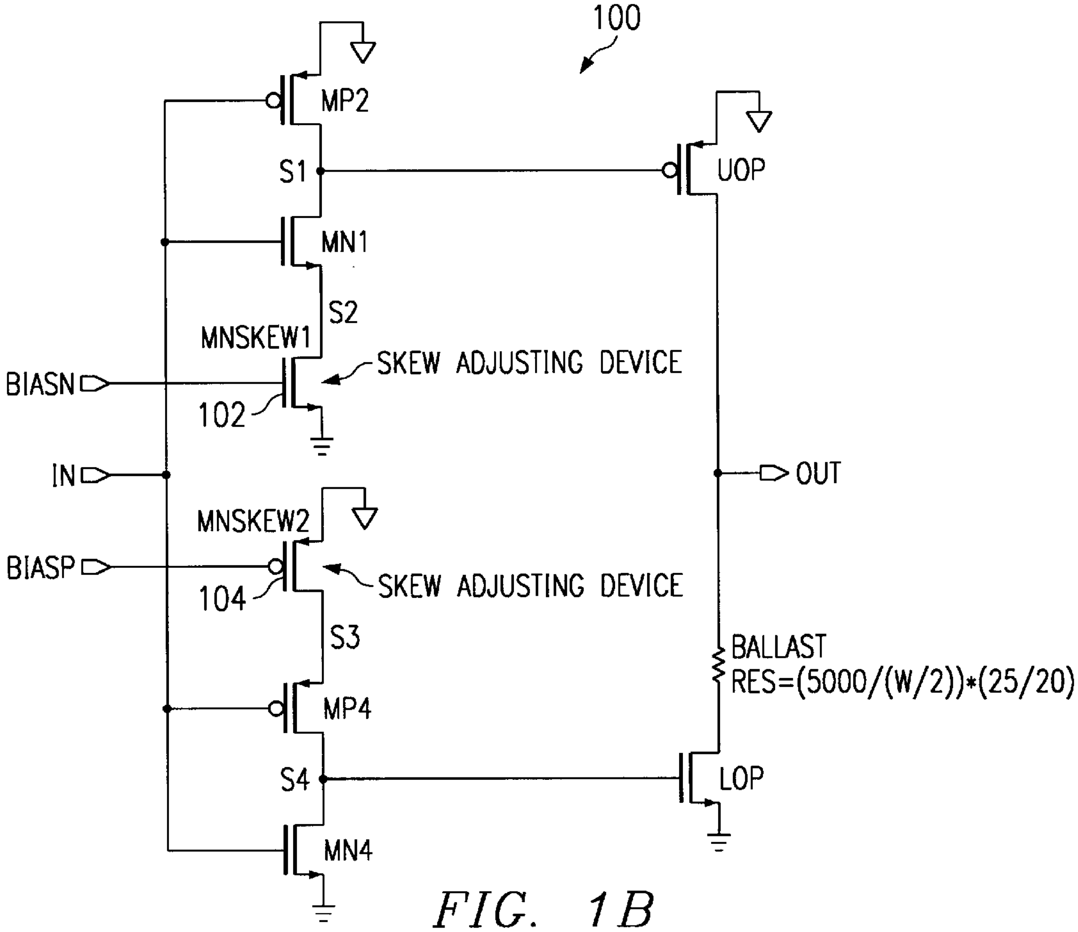
FIG. 1B (PRIOR ART)
FIG. 1B is a schematic diagram illustrating a known output circuit that is biased via the bias generator depicted in FIG. 1A.
Figure 2:
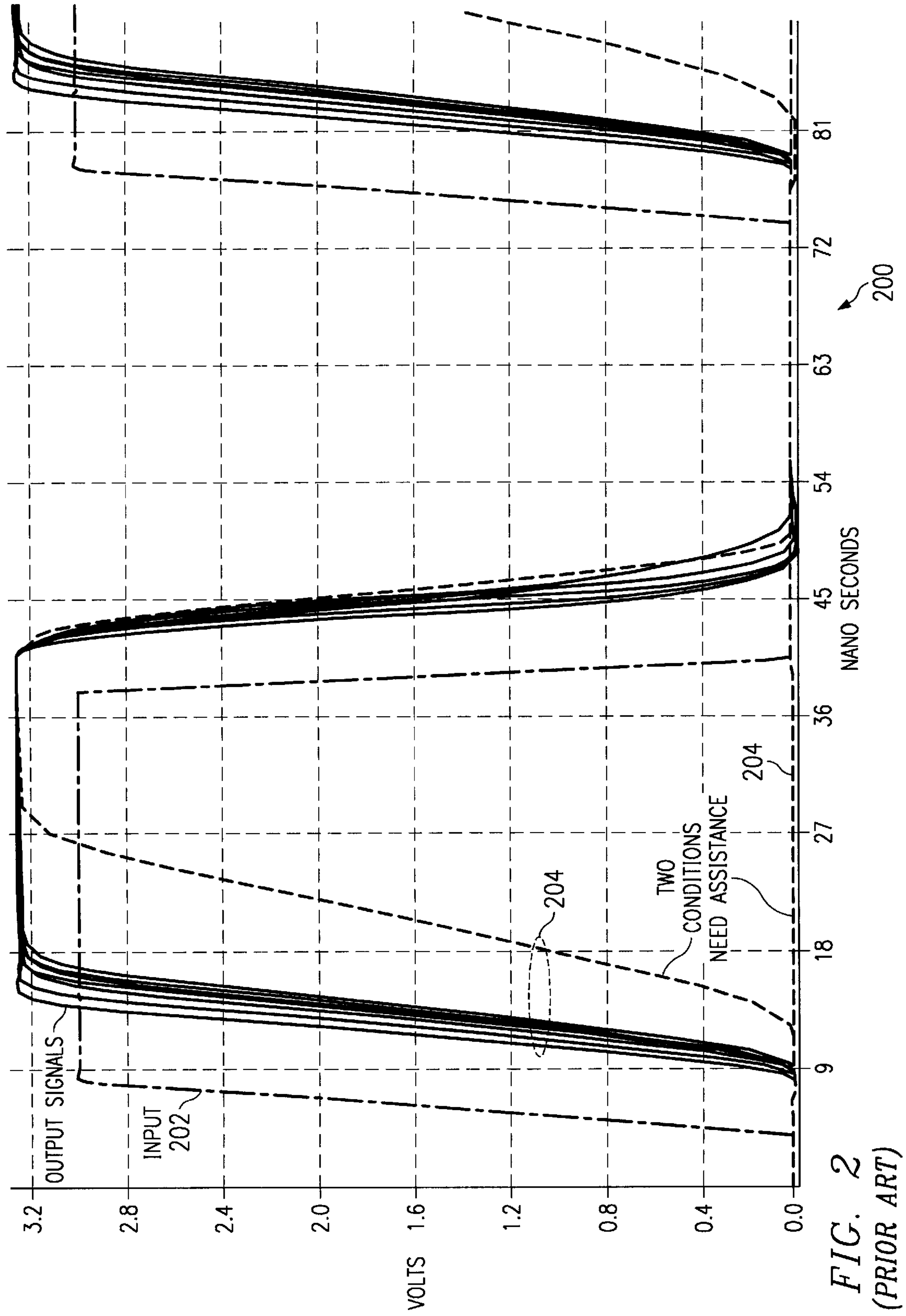
FIG. 2 (PRIOR ART)
FIG. 2 is a waveform diagram illustrating input and output signal waveforms associated with the output voltage bias generator shown in FIG. 1A and the output circuit shown in FIG. 1B.

The present invention is best understood by first reiterating a discussion of the prior art with reference to FIGS. 1A, 1B and 2. Known bias generator circuits are problematic in that they generate bias voltages to their associated output circuits that are inordinately sensitive to process, temperature and supply voltage variations, thereby limiting overall circuit performance capabilities. When the process is strong, temperature is low and supply voltage is at the maximum level, the output low-to-high and high-to-low propagation delays associated with an output circuit that is biased via the bias generator circuit are at their fastest. When the process is weak, temperature is high and supply voltage is at the minimum level, the output low-to-high and high-to-low propagation delays associated with an output circuit that is biased via the bias generator circuit are at their slowest.

FIG. 1A is a schematic diagram illustrating a known output voltage bias generator 10 that supplies different voltage levels (biasp 12 and biasn 14) to an output circuit 100 illustrated in FIG. 1B, wherein the different voltage levels are sensitive to variations in the process, ambient and operating temperatures, supply voltage and resistor tolerance. The bias generator 10 in combination with output circuit 100 promotes tight low-to-high and high-to-low output skews over the variation of operating conditions.

When the process is strong, temperature is low and supply voltage is at the maximum level (herein referred to as the first operating condition), the biasp 12 level is at a higher voltage level and the biasn 14 level is at a lower voltage level than they would otherwise be when the process is weak, temperature is high and supply voltage is at its minimum level (herein after referred to as the second condition). During a first condition situation therefore, the biasp 12 and biasn 14 voltage levels are closer to the thresholds of the skew adjusting devices MNSKEW1 (102) and MNSKEW2 (104), and will weaken the skew adjusting devices 102, 104. This will slow down the low-to-high and high-to-low propagation delays, pushing the skew closer to the second operating condition.

During a second condition situation, the biasp 12 level is at a lower voltage level than it would otherwise be during a first condition situation; and the biasn 14 level is at a higher voltage level than it would be during a first condition situation. During a second condition situation therefore, the biasp 12 and biasn 14 voltage levels "turn on" the skew adjusting devices 102, 104 harder than during a first condition situation, and will not weaken the skew adjusting devices 102, 104 as much as that caused during a first condition situation. The foregoing described varying voltage levels for biasp 12 and biasn 14 will cause the low-to-high and high-to-low skews to become tighter over process, temperature and supply voltage extremes.

The output voltage bias generator 10 is problematic however, in that it can get into a condition (variation in process, temperature, supply voltage and resistor tolerance) where the biasp 12 and biasn 14 voltage levels supplied to the skew adjusting devices 102, 104 in the output circuit 100 are at a "choking off" voltage level (i.e. weakening the skew devices 102, 104 by supplying biasp 12 and biasn 14 voltage levels to their respective gates that are too close the operating voltage thresholds). Although a designer can adjust certain parameters associated with the output voltage bias generator 10 to compensate for specific conditions, such adjustments will degrade the skew adjusting capabilities of the output voltage bias generator 10, and therefore reduce the usefulness of the output voltage bias generator 10.

FIG. 2 is a waveform plot diagram 200 illustrating input and output waveforms 202, 204 associated with the output voltage bias generator 10 and the output circuit 100 with a supply voltage of 3.3 volts at a nominal operating temperature of 25° C. Two operating conditions can be seen to need assistance. The first such operating condition is associated with a strong process coupled with a nominal resistance variation. The second such operating condition is associated with a strong process and a weak resistance variation. It can be appreciated that similar assistance is also necessary for other variations associated with process, temperature, supply voltage and resistor tolerance.

Figure 3A:
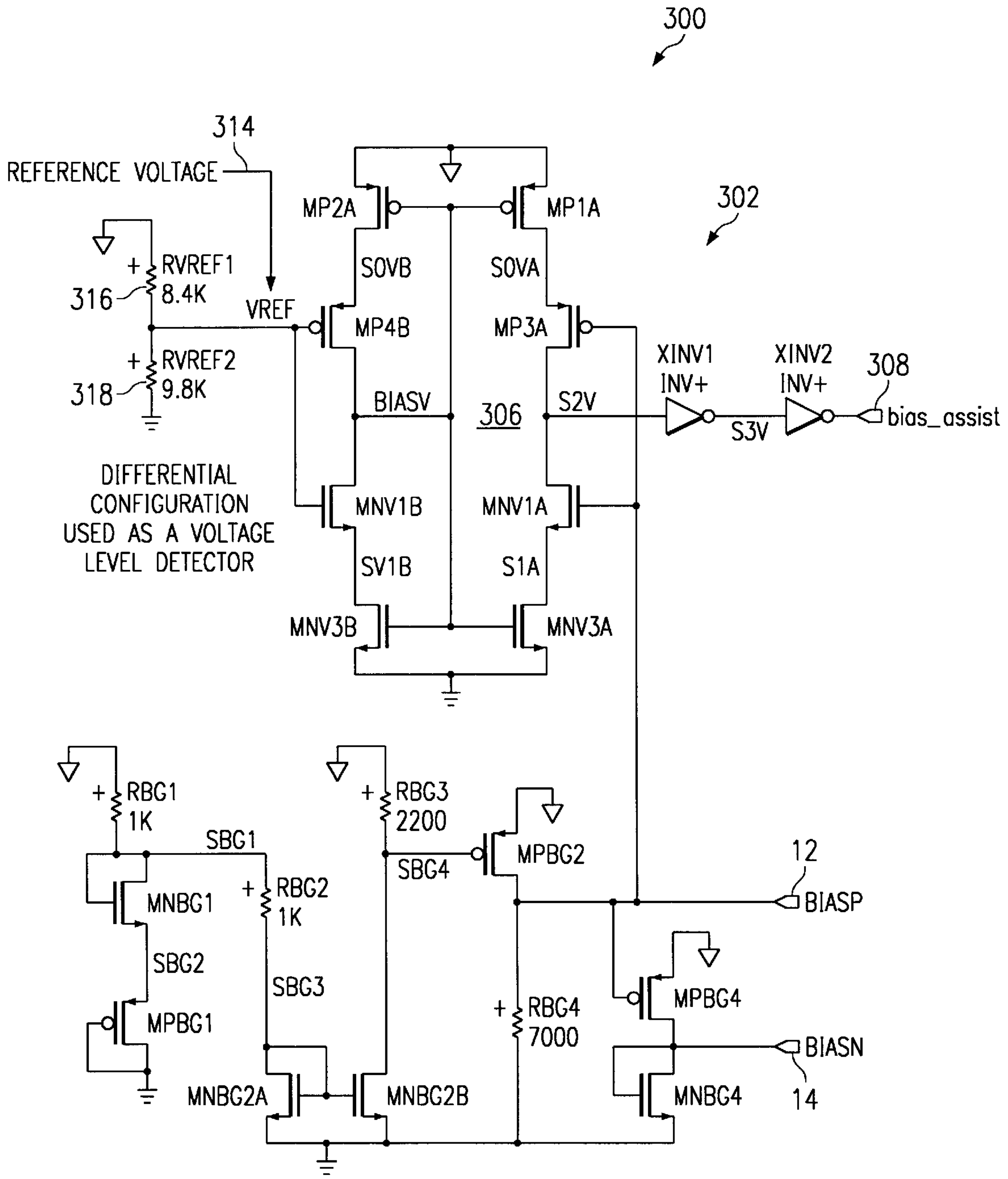
FIG. 3A is a schematic diagram illustrating an improved output voltage bias generator according to one embodiment of the present invention and that supplies different voltage levels (biasp and biasn) to an output circuit.

In view of the foregoing, a need exists for a method as well as a bias generator and associated output circuit architecture that protects output skew voltage capabilities for the associated output circuit to a greater extent than that achievable using presently known circuit architectures. FIG. 3A is a schematic diagram illustrating an improved output voltage bias generator 302 according to one embodiment of the present invention and that supplies more aggressive voltage levels (biasp 12 and biasn 14) to an output circuit 304 depicted in FIG. 3B. Output voltage bias generator 302 includes a voltage level detector 306 comprising a differential pair circuit. Biasp 12 and biasn 14 can now be set to their respective full skew adjusting capabilities since there is the voltage level detector 306 to help detect any weak bias level that biasp12 and biasn 14 might send to the output circuit 304. If there were no such voltage level detector 306, a designer would have to use a much less aggressive architecture 10 such as shown in FIG. 1A. This is problematic since the probability of manufacturing yield problems would be increased, a problem that is virtually eradicated via the system architecture 300 depicted in FIGS. 3A and 3B.

Figure 3B:
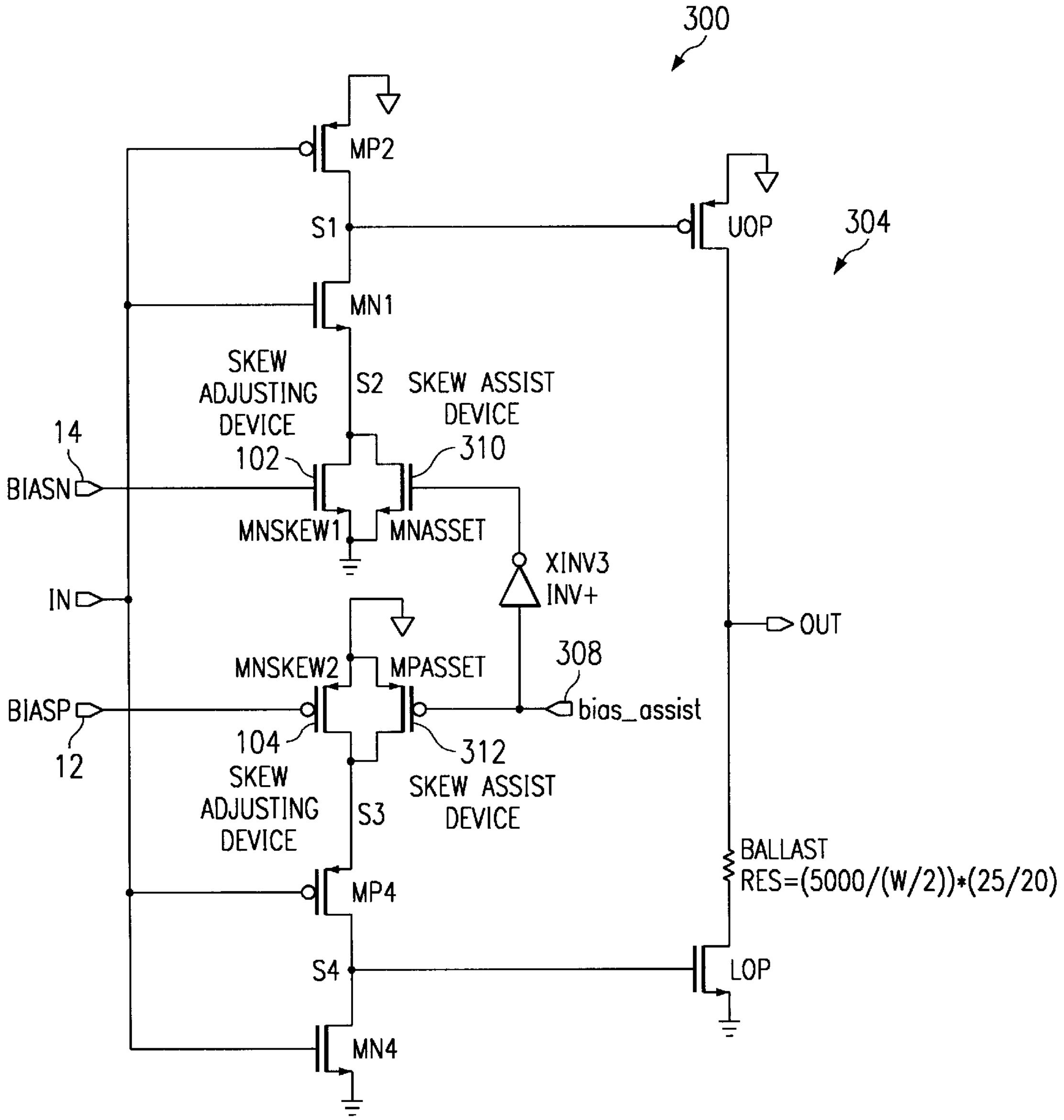
FIG. 3B is a schematic diagram illustrating an improved output circuit according to one embodiment of the present invention and that is biased via the bias generator depicted in FIG. 3A.

FIG. 3B is a schematic diagram illustrating an improved output circuit 304 according to one embodiment of the present invention and that is biased via the bias generator 302 depicted in FIG. 3A. The output circuit 304 includes skew assist devices 310, 312 that are responsive to a signal generated via the differential pair circuit that forms part of the voltage level detector 306. Together, the output voltage bias generator 302 and the output circuit 304 combine to form the system architecture 300.

Theory of Operation

When the biasp 12 signal is in a condition where its voltage level is high enough to "choke off" skew adjusting device 102, the voltage level detector 306 comprising the differential pair circuit sends a bias_assist signal 308 to the output circuit 304 and "turns on" skew assist devices 310, 312 to assist the skew adjusting devices 102, 104 respectively. A desired reference voltage 314 can set established in the voltage level detector 306 by adjusting voltage RVREF1 (316) and voltage RVREF2 (318). When the biasp 12 voltage level rises above the desired reference voltage 314 level, the bias_assist signal 308 sends a "LOW" signal to the output circuit 304 and "turns on" the skew assist devices 310, 312. Functioning as an analog-to-digital converter (ADC), the voltage level detector 306 detects an analog voltage signal for biasp 12 and converts it to a digital voltage signal (bias_assist) 308. The present inventor found that whenever the biasn signal 14 needed assistance, the biasp signal 12 also required assistance; and therefore, using only the biasp signal 12 effectively managed any "weak" bias voltage levels.

Figure 4:
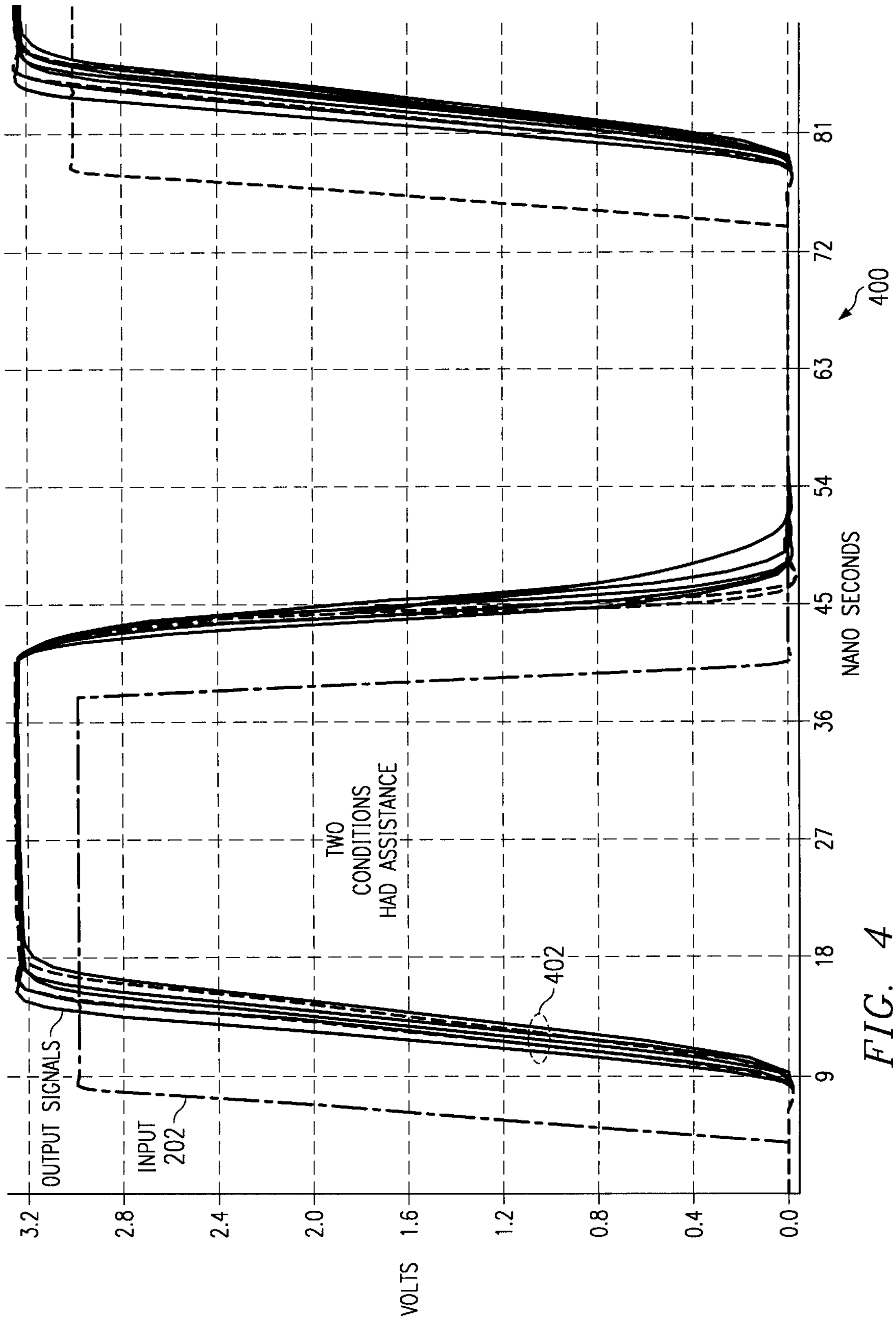
FIG. 4 is a waveform diagram illustrating input and output signal waveforms associated with the improved output voltage bias generator shown in FIG. 3A and the improved output circuit shown in FIG. 3B.

FIG. 4 is a waveform diagram 400 illustrating input and output signal waveforms 202, 402 associated with the improved output voltage bias generator 302 shown in FIG. 3A and the improved output circuit 304 shown in FIG. 3B. It can be seen the two operating conditions needing assistance depicted in FIG. 2 have been effectively eliminated. The first operating condition associated with a strong process coupled with a nominal resistance variation and the second operating condition associated with a strong process and a weak resistance variation no longer exhibit weak skews, but instead conform with the family of desired output signals 402.

In view of the above, it can be seen the present invention presents a significant advancement in the art of voltage bias generator circuits. Further, this invention has been described in considerable detail in order to provide those skilled in the voltage bias generator art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A voltage bias generator comprising:

an output circuit having a plurality of voltage skew adjusting devices and a plurality of voltage skew assist devices, the output circuit responsive to an input signal to generate an output signal having a desired skew;

a bias voltage circuit configured to generate desired bias voltage signals for the plurality of voltage skew adjusting devices; and a voltage sensing circuit responsive to at least one of the desired bias voltage signals to generate desired bias voltage signals for the plurality of voltage skew assist devices such that the output signal has the desired skew.

2. The voltage bias generator according to claim 1 wherein the voltage sensing circuit comprises a differential pair voltage level detector configured to detect voltage levels associated with the desired bias voltage signals and generate the desired bias voltage signals therefrom.

3. A voltage bias generator comprising:

voltage skew adjusting means for adjusting an output skew voltage associated with an output signal of an output circuit in response to an input signal applied to an input of the output circuit;

voltage skew assisting means for assisting the voltage skew adjusting means such that the voltage skew adjusting means are not be choked off by having bias levels to control electrodes of the voltage skew adjusting means that are close to operating voltage thresholds resulting from a condition selected from the group consisting of temperature, process, supply voltage and resistor tolerance;

biasing means for biasing the voltage skew adjusting means; and voltage detecting means for detecting bias voltage output signals associated with the biasing means and for generating desired bias voltage signals for the voltage skew assisting means such that the output signal has a desired skew.

4. The voltage bias generator according to claim 3 wherein the voltage detecting means comprises a differential pair voltage level detector configured to detect voltage levels associated with the bias voltage output signals and generate the desired bias voltage signals therefrom.

5. A voltage generator circuit operational to sense an input voltage signal and generate an output signal having a desired voltage skew, the voltage generator circuit comprising skew adjusting devices responsive to first bias signals generated by a first bias voltage generator and further comprising skew assist devices responsive to second bias signals generated by a second bias voltage generator to assist the skew adjusting devices control of the desired voltage skew such that the skew adjusting devices are not choked off by having bias levels to control electrodes of the voltage skew adjusting means that are close to operating voltage thresholds resulting from a condition selected from the group consisting of temperature, process, supply voltage and resistor tolerance.

6. The voltage bias generator according to claim 5 wherein the second bias voltage circuit comprises a differential pair voltage level detector configured to detect voltage levels associated with the first internally generated bias signals and generate the second internally generated bias signals therefrom.

7. A method of controlling output skew voltage, the method comprising:

providing a voltage generator comprising skew voltage adjusting devices and skew assist devices;

providing an input signal to the voltage generator;

generating an output voltage signal having a desired skew; and adjusting the output skew voltage via the skew assist devices such that the skew adjusting devices are not choked off by having bias levels to control electrodes of the voltage skew adjusting means that are close to operating voltage thresholds resulting from a condition selected from the group consisting of temperature, process, supply voltage and resistor tolerance.

* * * * *